(12) United States Patent
Tai et al.

(10) Patent No.: US 8,817,142 B2
(45) Date of Patent: Aug. 26, 2014

(54) IMAGE SENSOR WITH DUAL ELEMENT COLOR FILTER ARRAY AND THREE CHANNEL COLOR OUTPUT

(71) Applicant: OmniVision Technologies, Inc., Santa Clara, CA (US)

(72) Inventors: Hsin-Chih Tai, San Jose, CA (US); Yin Qian, Milpitas, CA (US); Duli Mao, Sunnyvale, CA (US); Vincent Venezia, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 52 days.

(21) Appl. No.: 13/686,776

(22) Filed: Nov. 27, 2012

(65) Prior Publication Data

US 2013/0083223 A1   Apr. 4, 2013

Related U.S. Application Data

(62) Division of application No. 12/842,808, filed on Jul. 23, 2010, now Pat. No. 8,345,132.

(51) Int. Cl.
*H04N 3/14* (2006.01)
*H04N 5/335* (2011.01)
*H04N 9/04* (2006.01)
*H04N 9/083* (2006.01)
*H01L 27/146* (2006.01)

(52) U.S. Cl.
CPC .......... *H04N 9/045* (2013.01); *H01L 27/14643* (2013.01); *H01L 27/14621* (2013.01)
USPC .......................................... 348/280; 348/222.1

(58) Field of Classification Search
CPC .......................... H04N 9/045; H04N 2209/046
USPC ................................. 348/222.1, 272, 294, 280
See application file for complete search history.

(56) References Cited

U.S. PATENT DOCUMENTS

| 4,951,130 A | 8/1990 | Iizuka et al. |
| 5,028,547 A | 7/1991 | Iizuka et al. |

(Continued)

FOREIGN PATENT DOCUMENTS

| CN | 101150735 A | 3/2008 |
| KR | 20010059228 A | 7/2001 |

OTHER PUBLICATIONS

U.S. Office Action mailed Aug. 15, 2012, U.S. Appl. No. 12/842,808, filed Jul. 23, 2010 (6 pages).

(Continued)

*Primary Examiner* — Gevell Selby
(74) *Attorney, Agent, or Firm* — Blakely Sokoloff Taylor & Zafman LLP

(57) ABSTRACT

A color image sensor includes a pixel array including CFA overlaying an array of photo-sensors for acquiring color image data. The CFA includes first color filter elements of a first color overlaying a first group of the photo-sensors and second color filter elements of a second color overlaying a second group of the photo-sensors. The first group of photo-sensors generate first color signals of a first color channel and the second group of photo-sensors generate second color signals of a second color channel. The color image sensor further includes a color signal combiner circuit ("CSCC") coupled to receive the first and second color signals output from the pixel array. The CSCC includes a combiner coupled to combine the first and second colors signals to generate third color signals of a third color channel. An output port is coupled to the CSCC to output the color image data.

5 Claims, 10 Drawing Sheets

(56) References Cited

U.S. PATENT DOCUMENTS

| | | | |
|---|---|---|---|
| 6,847,397 B1 | 1/2005 | Osada | |
| 7,196,829 B2 * | 3/2007 | Vook et al. | 358/513 |
| 7,259,789 B1 | 8/2007 | Endo et al. | |
| 7,323,676 B2 | 1/2008 | Duijve | |
| 2007/0024931 A1 | 2/2007 | Compton et al. | |
| 2007/0177033 A1 * | 8/2007 | Bennett et al. | 348/223.1 |
| 2008/0191298 A1 | 8/2008 | Lin et al. | |
| 2009/0200584 A1 | 8/2009 | Tweet et al. | |
| 2009/0230394 A1 | 9/2009 | Nagaraja et al. | |
| 2009/0321617 A1 | 12/2009 | Kim et al. | |
| 2010/0104178 A1 * | 4/2010 | Tamburrino et al. | 382/167 |
| 2010/0104214 A1 | 4/2010 | Tamburrino et al. | |
| 2011/0018993 A1 * | 1/2011 | Wang et al. | 348/135 |
| 2012/0019696 A1 | 1/2012 | Tai et al. | |

OTHER PUBLICATIONS

U.S. Notice of Allowance mailed Nov. 2, 2012, U.S. Appl. No. 12/842,808, filed Jul. 23, 2010 (13 pages).

U.S. Office Action mailed Oct. 17, 2013, U.S. Appl. No. 13/686,788, filed Nov. 27, 2012 (11 pages).

CN 201110218062.6; First Chinese Office Action issued Jul. 23, 2013, 17 pages.

U.S. Notice of Allowance mailed Jan. 10, 2014, U.S. Appl. No. 13/686,788, filed Nov. 27, 2012 (13 pages).

CN 201110218062.6; Decision on Rejection, Mar. 3, 2014, 17 pages.

\* cited by examiner

IMAGE SENSOR WITH DUAL ELEMENT COLOR FILTER ARRAY AND THREE CHANNEL COLOR OUTPUT

CROSS-REFERENCE TO RELATED APPLICATION

The present application is a Divisional of U.S. patent application Ser. No. 12/842,808, filed on Jul. 23, 2010.

TECHNICAL FIELD

This disclosure relates generally to image sensors, and in particular but not exclusively, relates to color image sensors.

BACKGROUND INFORMATION

Color image sensors are used in various applications from simple and inexpensive mobile-phone cameras and digital cameras to sophisticated and expensive medical and scientific equipment. Conventional color image sensors include a pixel array having a color filter array ("CFA") overlaying an array of photosensitive elements, which convert the intensity of the color filtered light into electrical signals.

The CFA typically includes three color filter elements for generating a three channel color output. Often three primary color filters are used to generate three primary color signals: red (R), green (G), and blue (B) signals. Thus, each pixel in the pixel array is sensitive to one of the three primary colors and outputs a corresponding color signal. For example, to produce a R signal, the pixel is covered by a red color filter element, to produce a G signal, the pixel is covered by a green color filter element, and to produce a B signal, the pixel is covered by a blue color filter element. Accordingly, at least three different color filter elements are used. The three different color filter elements use three separate fabrication procedures to fabricate the complete three color element CFA.

FIG. 1 illustrates an example Bayer pattern CFA 10 formed using R pixels, G pixels, and B pixels. CFA 10 generates a three channel color output of R, G, and B signals. CFA 10 may have hundreds or even thousands of rows and columns. The Bayer pattern CFA uses a repeating pattern of macropixel groups 20. Each macropixel group 20 includes four micropixels 30: a R pixel, a B pixel, and two G pixels. A single macropixel group 20 produces a R signal, a G signal (the two G signals are combined), and a B signal. Each macropixel group 20 may be considered the smallest element of a color image produced by the color image sensor, where each macropixel group 20 corresponds to a single image pixel in the output image data. In other words, the resolution of the output image directly corresponds to the linear density of macropixel groups 20. The R, G, and B signals output by the individual micropixels 30 of a single macropixel group 20 are combined to form an individual color image pixel in the output color image data.

The extraction of R, G, and B signals from each macropixel group 20 is straightforward. The R pixel produces the R signal, the G pixels produce the G signal, and the B pixel produces the B signal. Of course, the G signal is larger than either R or B signal for the same light intensity, which mimics the human eye's higher sensitivity to green light compared to red and blue light. Thus, conventional color image sensors have a one-to-one correspondence between the number of distinct colors in the filter elements of the CFA and the number of output color channels.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus, and methods of operation and fabrication of the same, for an image sensor with dual element color filter array ("CFA") and three channel color output are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
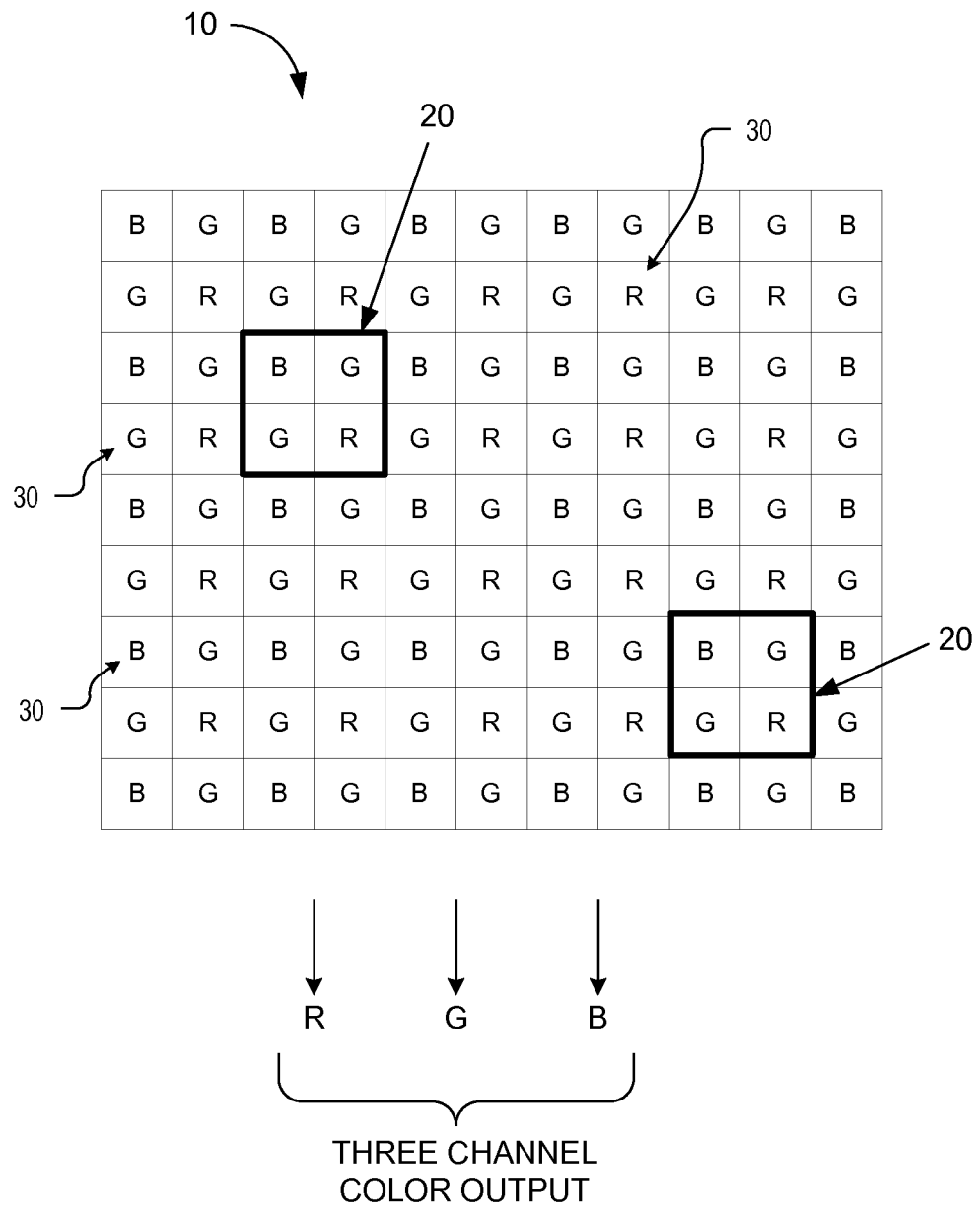
FIG. 1 (PRIOR ART) illustrates a conventional Bayer pattern color filter array ("CFA").
Figure 2:
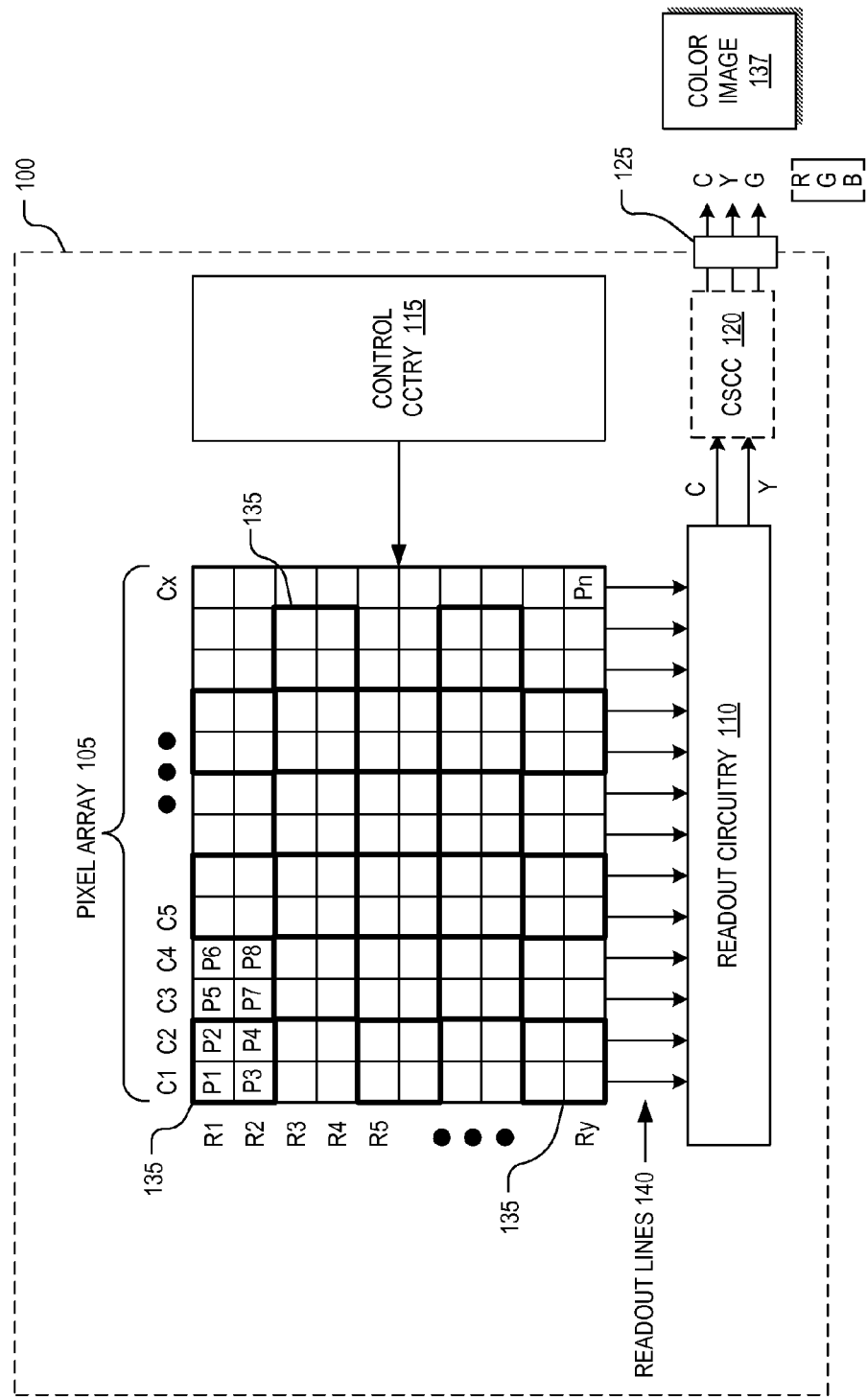
FIG. 2 is a functional block diagram illustrating a color imaging system including a pixel array having a CFA with two color filter elements, but which imaging system is capable of generating a three channel color output, in accordance with an embodiment of the invention.

FIG. 2 is a block diagram illustrating a color imaging system 100 (also referred to as color image sensor 100), in accordance with an embodiment of the invention. The illustrated embodiment of color imaging system 100 includes a pixel array 105, readout circuitry 110, control circuitry 115, and an output port 125. The illustrated embodiment further includes a color signal combining circuit ("CSCC") 120, though some embodiments may operate without CSCC 120 or with CSCC 120 disabled or by-passed. In one embodiment, the illustrated components of color imaging system 100 are all integrated on a single semiconductor die that has a CFA with only two types of color filter elements, but outputs from the die three channel color image data.

Pixel array 105 is a two-dimensional ("2D") array of pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object. In one embodiment, pixel array 105 is a backside illuminated ("BSI") image array. In one embodiment, pixel array 105 is a frontside illuminated ("FSI") image array. Pixel array 105 includes a pattern of individual color filter elements or color filter array ("CFA") disposed over the light incident side of pixel array 105. The color filter element pattern repeats within each macropixel group 135 across pixel array 105. Each macropixel group 135 is made up of multiple individual pixels P1-Pn (also referred to as micropixels to emphasis their relationship as members of a given macropixel group). In one embodiment, each macropixel group 135 corresponds to an individual image pixel within the output color image 137 and includes four pixels (e.g., P1-P4, P5-P8, etc.)

After each pixel has acquired its image data or image charge, the image data is readout by readout circuitry 110. Readout circuitry 110 may include amplification circuitry, analog-to-digital ("ADC") conversion circuitry, or otherwise. In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Embodiments of the present invention use a color combiner unit to combine two color channels to generate three color channels for a color image. In a first embodiment, the color combiner unit includes circuitry (e.g., digital logic, analog summation circuitry, analog multiplication circuitry, other analog/digital circuitry, microprocessor and software/firmware logic, etc.) for combining two color signals output by pixel array 105 to generate three color channel image data. In a second embodiment, the color combiner unit is implemented using filter stacks of two separate color filters to optically combine the color channels associated with each of the color filter elements to generate third color channel. In this second embodiment, pixel array 105 outputs three color signals.

In one embodiment, pixel array 105 outputs image signals on readout lines 140 to readout circuitry 110 that includes two secondary color channels, such as a cyan (C) channel and a yellow (Y) channel (illustrated), a C channel and a magenta (M) channel, an M channel and a Y channel, or otherwise. This two channel color data is then input into CSCC 120, which is a color combiner unit combining the two channel image data to generate three channel image data for color image 137. For example, the three channel image data may include C, Y, and green (G) color channels (illustrated); C, M, and blue (B) color channels; M, Y, and red (R) color channels; or otherwise. In one embodiment, CSCC 120 includes further circuitry to transform two secondary color channels into three primary color channels R/G/B, which is a common color image format.

In one embodiment, pixel array 105 outputs image signals on readout lines 140 to readout circuitry 110 that includes three color channels. In this embodiment, CSCC 120 may not be included or otherwise disabled/by-passed. Alternatively, CSCC 120 may be enabled to transform three color channels from pixel array 105 to the three channel primary color combination, or even transform from one combination including two secondary colors to another combination including different secondary colors. Examples of three color channel combinations output directly from pixel array 105 include C/Y/G, C/M/B, M/Y/R, or otherwise.

Although CSCC 120 is illustrated as being separate from readout circuitry 110, in some embodiments, the functionality and/or logic of CSCC 120 may be entirely or partially incorporated into readout circuitry 110. In one embodiment, CSCC 120 may even be coupled externally to the die upon which pixel array 105, readout circuitry 110, and control circuitry 115 are integrated. In one embodiment, CSCC 120 is implemented using hardware. In one embodiment, CSCC 120 may even be implemented partially or entirely in software.

Control circuitry 115 is coupled to pixel array 105 to control operational characteristics of pixel array 105. For example, control circuitry 115 may generate a shutter signal for controlling image acquisition. In one embodiment, the shutter signal is a global shutter signal for simultaneously enabling all pixels within pixel array 105 to simultaneously capture their respective image data during a single acquisition window. In an alternative embodiment, the shutter signal is a rolling shutter signal whereby each row, column, or group of pixels is sequentially enabled during consecutive acquisition windows.

Embodiments of the present invention may implement macropixels 135 using various combinations of just two color filter elements, as opposed to the three color filter elements used in the conventional Bayer pattern. The R, G, B, colors used in the Bayer pattern are referred to as primary colors or primary color channels while the combination of R, G, & B is referred to as the primary color set. The Bayer pattern may also use alternative secondary colors such as cyan (C), magenta (M), and yellow (Y). The primary colors are related to the secondary colors according to equations (Eq. 1) to (Eq. 6) below.

$$C = B + G \tag{Eq. 1}$$

$$M = B + R \tag{Eq. 2}$$

$$Y = R + G \tag{Eq. 3}$$

$$R = (Y + M - C)/2 \tag{Eq. 4}$$

$$G = (Y - M + C)/2 \tag{Eq. 5}$$

$$B = (C + M - Y)/2 \tag{Eq. 6}$$

Based on the above equations, to get R, G, and B signals, conventional CFAs used three separate R, G, and B, color filter elements or three separate C, M, and Y color filter elements. In either conventional case, three separate color filters elements are used, which requires three distinct processing procedures during fabrication to lay down the three different colored filter materials.

Figure 3:
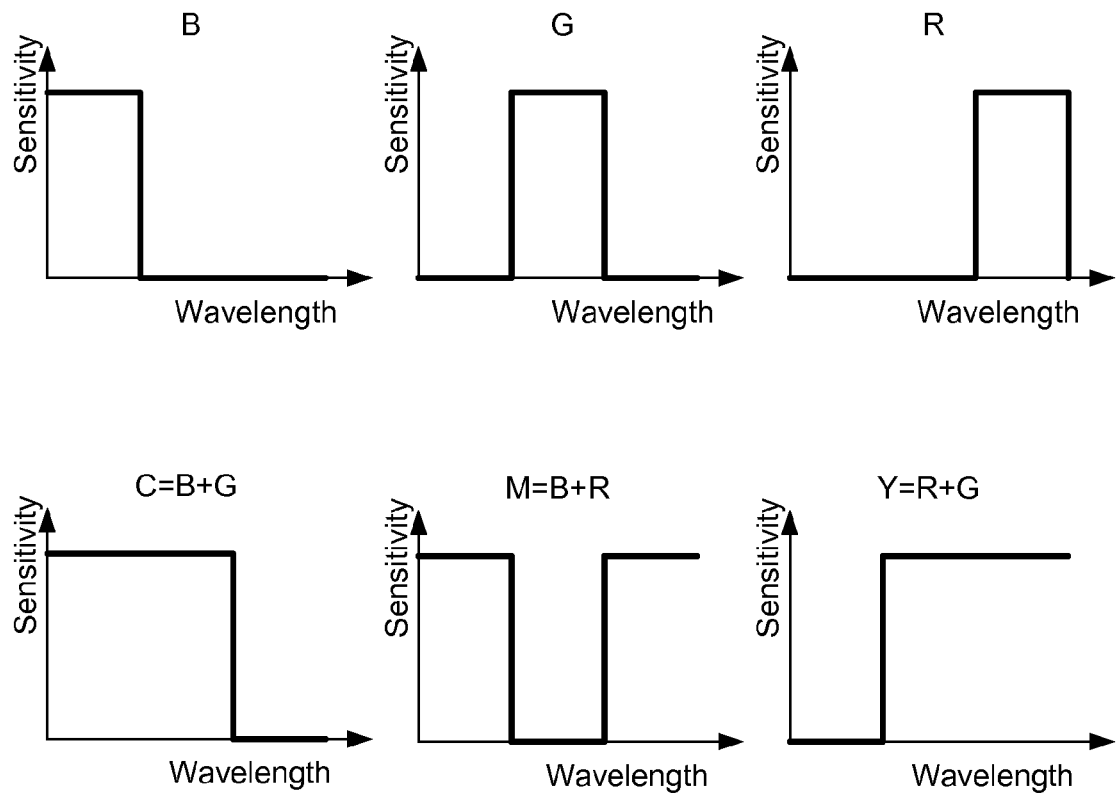
FIG. 3 is a schematic illustrating normalized sensitivity functions for red, green, blue, cyan, magenta, and yellow signals, in accordance with an embodiment of the invention.
Figure 4:
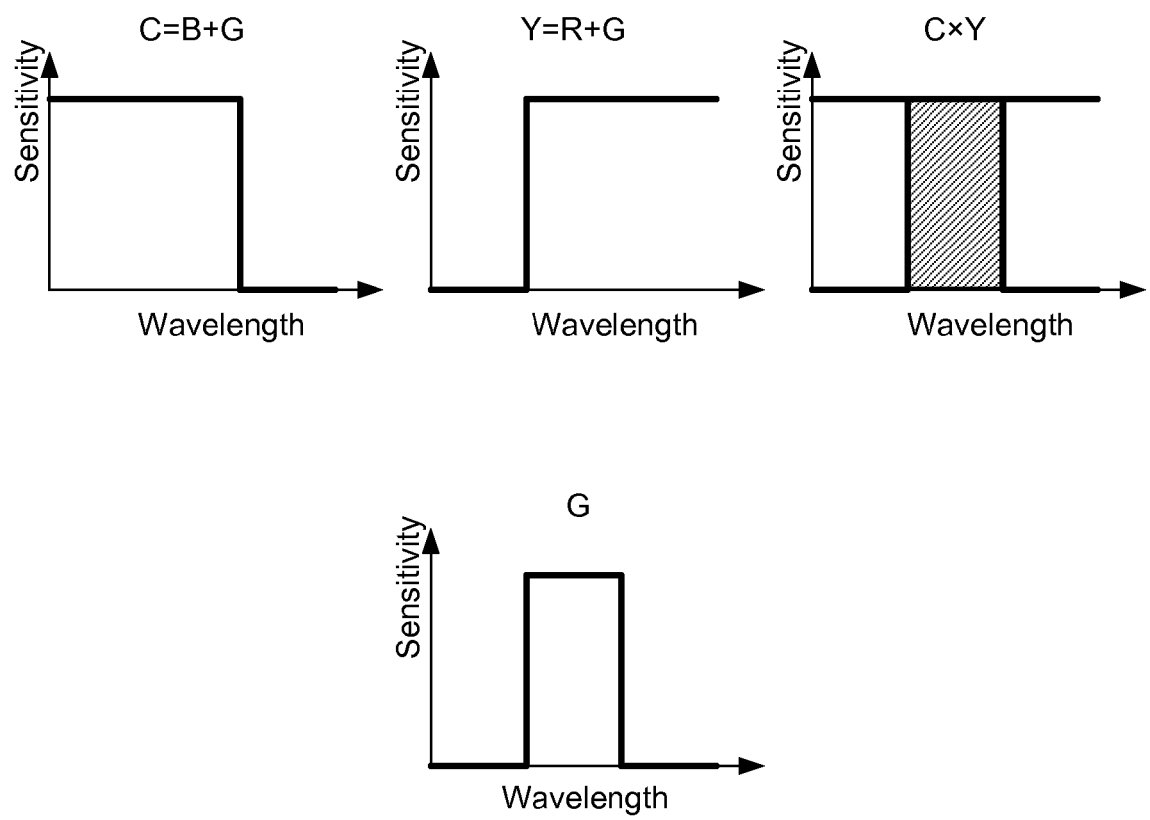
FIG. 4 is a schematic illustrating how the green sensitivity function is a product of the cyan and yellow sensitivity functions, in accordance with an embodiment of the invention.
Figure 5:
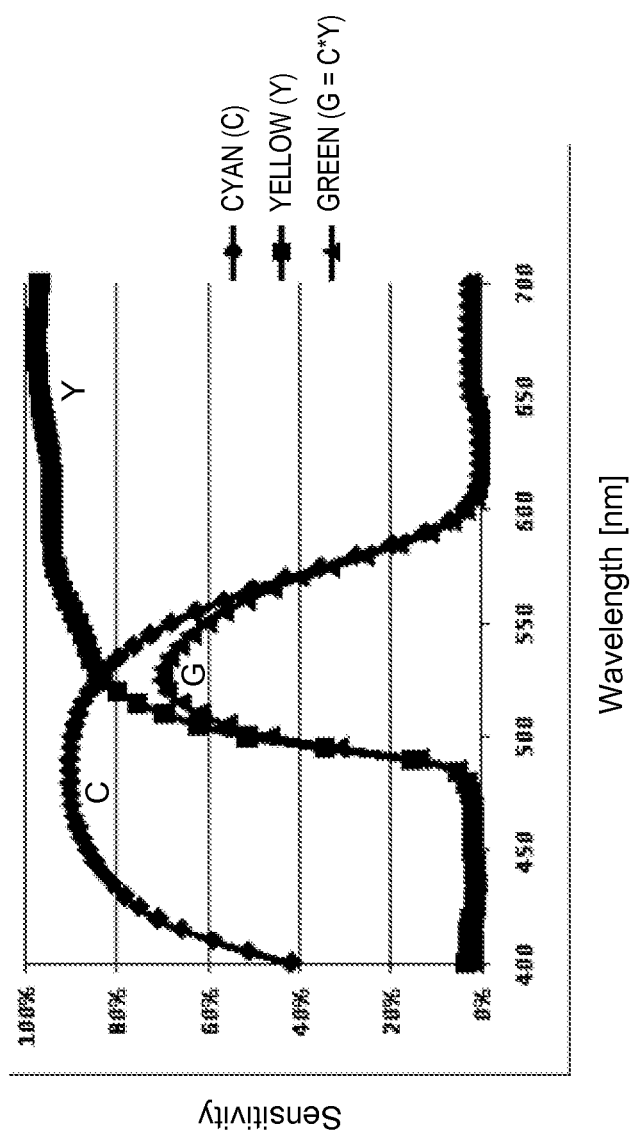
FIG. 5 is a graph illustrating sensitivity functions of cyan and yellow color filter elements, in accordance with an embodiment of the invention.

Eqs. (1) to (3) are schematically represented in FIG. 3, where the vertical axis of each chart is a normalized sensitivity and the horizontal axis is a wavelength. FIG. 4 illustrates that the multiplication of the C sensitivity function and the Y sensitivity function results in the G sensitivity function (e.g., G=C*Y). Therefore, a G color signal can be produced from the C signal and the Y signal (i.e., G=C*Y) output by the photo-sensors overlaid by a C color filter element and Y color filter element, respectively. Furthermore, referring to Eq. (1), a B signal can be produced from the C color signal and G color signal (i.e., B=C−G) and the R color signal can be produced from the Y color signal and the G color signal (i.e., R=Y−G). FIG. 5 illustrates two example sensitivity functions for a C color filter element and a Y color filter element, respectively. The product of the C and Y sensitivity functions, which is the G sensitivity function, is also illustrated.

Figure 6:
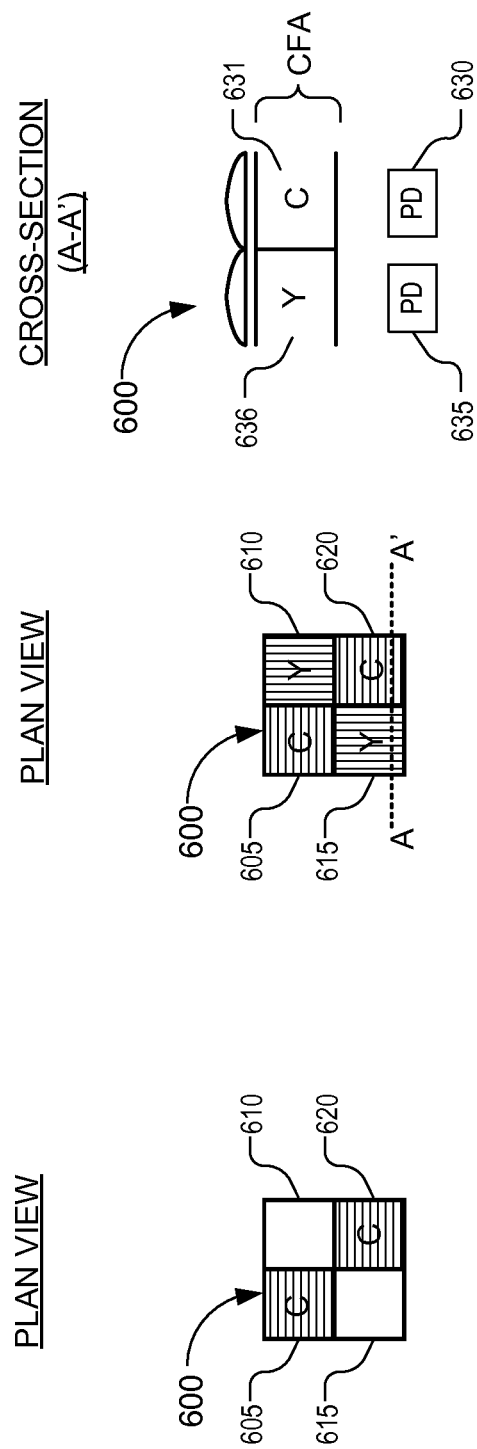
FIGS. 6A-6C illustrate the fabrication of a macropixel group using two types of color filter elements to generate image signals, which can be combined to generate a three channel color output, in accordance with an embodiment of the invention.

FIGS. 6A-6C illustrate the fabrication of a macropixel group using two types of color filter elements to generate two channel image signals, which can be combined to generate a third channel for a three channel color output, in accordance with an embodiment of the invention. Macropixel group 600 is one possible implementation of macropixel groups 135 illustrated in FIG. 2. Macropixel group 600 includes four pixels 605, 610, 615, and 620. Pixels 605 and 620 include separate photo-sensors 630 (only one is illustrated in the cross-sectional view of FIG. 6C) covered by a color filter element 631 having a first color (e.g., a cyan color filter element is illustrated as an example). Pixels 610 and 615 include photo-sensors 635 covered by a color filter element 636 having a second color different from the first color (e.g., a yellow color filter element). FIG. 6A illustrates a first fabrication step where the first color filter layer is disposed over the pixel array and patterned to cover pixels 605 and 620 while removed from pixels 610 and 615. FIG. 6B illustrates a second fabrication step where the second color filter layer is formed over the remaining exposed pixels 610 and 615. FIG. 6C illustrates a cross-sectional view along line A-A' in FIG. 6B.

In the illustrated embodiment of FIGS. 6A-C, pixels 605 and 620 contribute to the C color signal. However, the C color signal may be from pixel 605, pixel 620, or the combination of both. Pixels 610 and 615 contribute to the Y color signal. However, the Y color signal may be from pixel 610, pixel 615, or the combination of both. The G color signal is generated based upon the product of the C color signal and the Y color signal. During operation, pixel array 105, implemented with macropixel groups 600, outputs image data having two types of color signals (i.e., two color channel image data). This two color channel image data is readout by readout circuitry 110 and provided to CSCC 120. In one embodiment, CSCC 120 includes operation for combining the two color image signals to generate an additional third color image signal such that a three channel image signal can be output from output port 125. In the example of C and Y color filter elements, CSCC 120 may include a multiplier to multiply the C and Y color signals to generate a G color signal. However, as discussed below, other combinations of color filter elements may require addition or subtraction functions to generate the third color channel signal based upon the two color channels output from pixel array 105.

In one embodiment, CSCC 120 may further include a color transformer so that secondary color signals (e.g., C, M, Y) can be transformed into primary color signals (e.g., R, G, B), or even to facilitate transformation between two different sets of secondary color signals. In this manner, color imaging system 100 may be capable of selecting and outputting a variety of different three channel color sets (e.g., RGB, CYG, CMB, MYR, or otherwise). The transformer may include addition and/or subtraction funtions, as discussed below. For example, if the macropixel groups 600 include C and Y color filter elements and the G color signal is generated by CSCC 120 via multiplication of the C and Y color signals, then the transformer function included within CSCC 120 may include a difference function to generate a B color signal via C−G (Eq. 1) or generate a R color signal via Y−G (Eq. 2).

Figure 7:
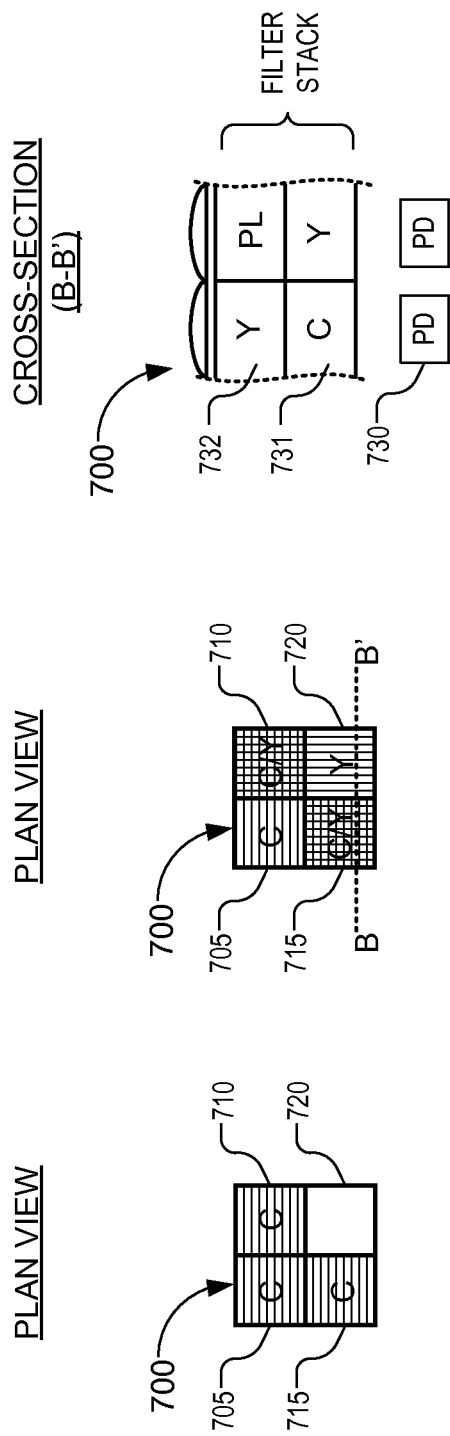
FIGS. 7A-7C illustrate the fabrication of a macropixel group using two types of color filter elements capable of directly outputting three color channels, in accordance with an embodiment of the invention.

FIGS. 7A-7C illustrate the fabrication of a macropixel group 700 using two types of color filter elements capable of directly outputting three color channels, in accordance with an embodiment of the invention. Macropixel group 700 is one possible implementation of macropixel groups 135 illustrated in FIG. 2. Macropixel group 700 includes four pixels 705, 710, 715, and 720. Pixels 710 and 715 include photo-sensors 730 (only one is illustrated in the cross-sectional view of FIG. 7C) each covered by two color filter elements 731 and 732 each having a different color (e.g., color filter element 731 is a cyan color and color filter element 732 is yellow, other color combination are possible). Pixels 705 and 720 each include a photo-sensor covered by a single type of color filter element. In the illustrated embodiment, pixel 705 is covered by a C color filter element while pixel 720 is covered by a Y color filter element. In one embodiment, a clear planarization layer may be disposed over pixels 705 and 720 such that the top surface of pixel array 105 is level for application of microlenses.

FIG. 7A illustrates a first fabrication step where the first color filter layer (e.g., cyan color filter material) is disposed over the pixel array and patterned to cover three pixels of each four pixel macropixel group 700 (e.g., pixels 705, 710, and 715) while removed from one pixel in macropixel group 700 (e.g., pixel 720). FIG. 6B illustrates a second fabrication step where the second color filter layer (e.g., yellow color filter material) is formed over three of the pixels within each macropixel group 700 (e.g., pixels 710, 715, and 720). This results in two of the pixels including a color filter stack of both color filter elements. FIG. 6C illustrates a cross-sectional view along line B-B' in FIG. 7B. In the illustrated embodiment, the Y color filter element is leveled with the adjacent filter stack using a clear planarization element (PL).

In the embodiment illustrated in FIGS. 7A-C, pixels 710 and 715 are covered by two different types of color filter elements. The sensitivity of pixels 710 and 715 is the product of these two different types of color filter elements. Stacking two different color filter elements causes an optical multiplication effect, similar to multiplying two different color signals. In the illustrated embodiment, pixels 710 and 715 contribute to generate a G color signal, since the G sensitivity function is the product of the C sensitivity function and the Y sensitivity function.

Thus, pixel array 105 implemented with embodiments of macropixel group 700 is capable of outputting image data having three different types of color signals (i.e., three color channel image data) with only two distinct types of color filter elements. In one embodiment, CSCC 120 may include a transformer to transform image data readout of pixel array 105 to a different three color channel set. For example, color image system 100 may output a three color channel signal including the primary color RGB. In this case, the transformer may generate the B color signal based on the difference of the C and G color signals and generate the R color signal based on the difference of the Y and G color signals.

It should be appreciated that the order of the color filter elements can be reversed (e.g., cyan on top and yellow on bottom). Furthermore, in some embodiments, only a single pixel within macropixel group 700 includes a dual color filter stack, while two of the other pixels covered by a single color filter may have their output color signals combined to increase the sensitivity towards that particular color.

Returning to FIG. 5, embodiments of the present invention appear to reduce color crosstalk between the G color signal and the individual C or Y color signals, since the G color signal is the product of the individual C and Y color signals. Furthermore, the G sensitivity function may be optimized for a given application by extending or varying the bandwidth of the G sensitivity function by selecting appropriate C and Y sensitivity functions.

In one embodiment, a pair of pixels (e.g., 605 and 610) may be logically grouped to form a macropixel group (e.g., the smallest logical grouping of pixels that contribute to a single pixel within color image 137). As seen in FIGS. 6A-C, only two pixels are needed to generate three color channels. As such, the resolution of pixel array 105 can be increased by reassigning a given macropixel group 135 to include just two pixels.

Figure 8:
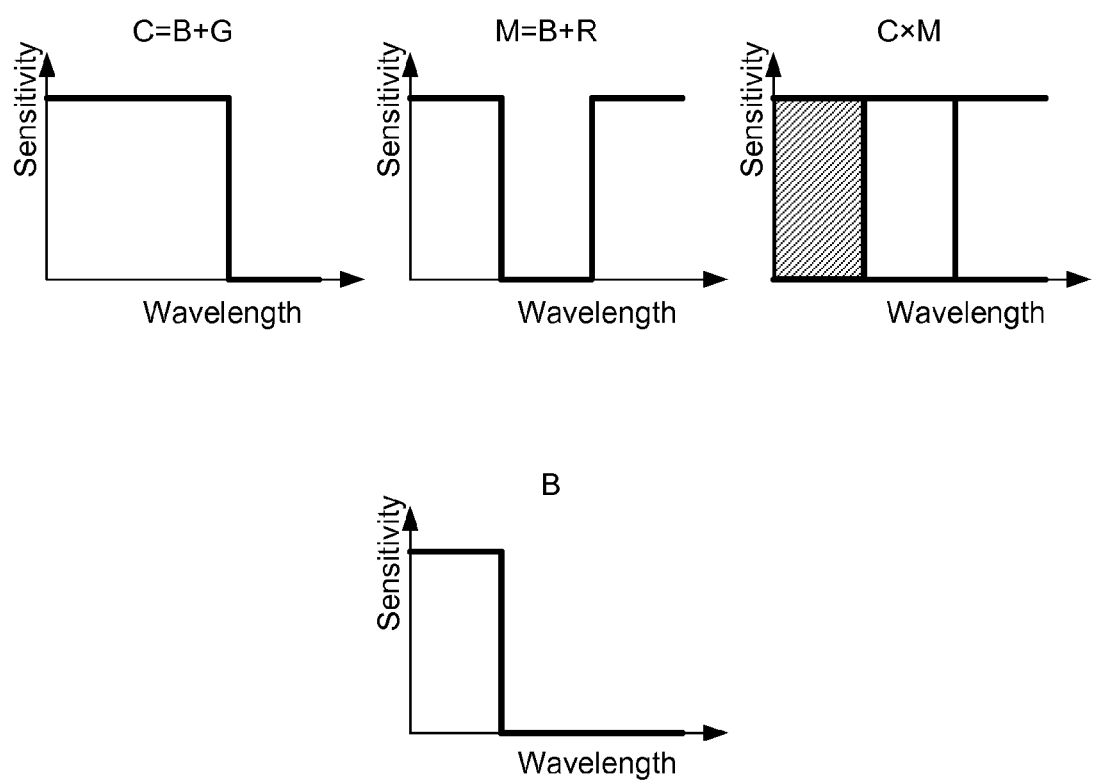
FIG. 8 is a schematic illustrating how the blue sensitivity function is a product of the cyan and magenta sensitivity functions, in accordance with an embodiment of the invention.

Pixel array 105 may be implemented with alternative color filter element combinations. For example, a set of C and M secondary color filter elements may be used. FIG. 8 is a schematic illustrating how the B sensitivity function is the product of the C and M sensitivity functions. Therefore, a B color signal can be produced from a C color signal and an M color signal (i.e., B=C*M). Referring to Eq. (1), a G color signal can be produced from a C color signal and a B color signal (i.e., G=C−B), and referring to Eq. (2) a R color signal can be produced from a M color signal and a B color signal (i.e., R=M−B).

Figure 9:
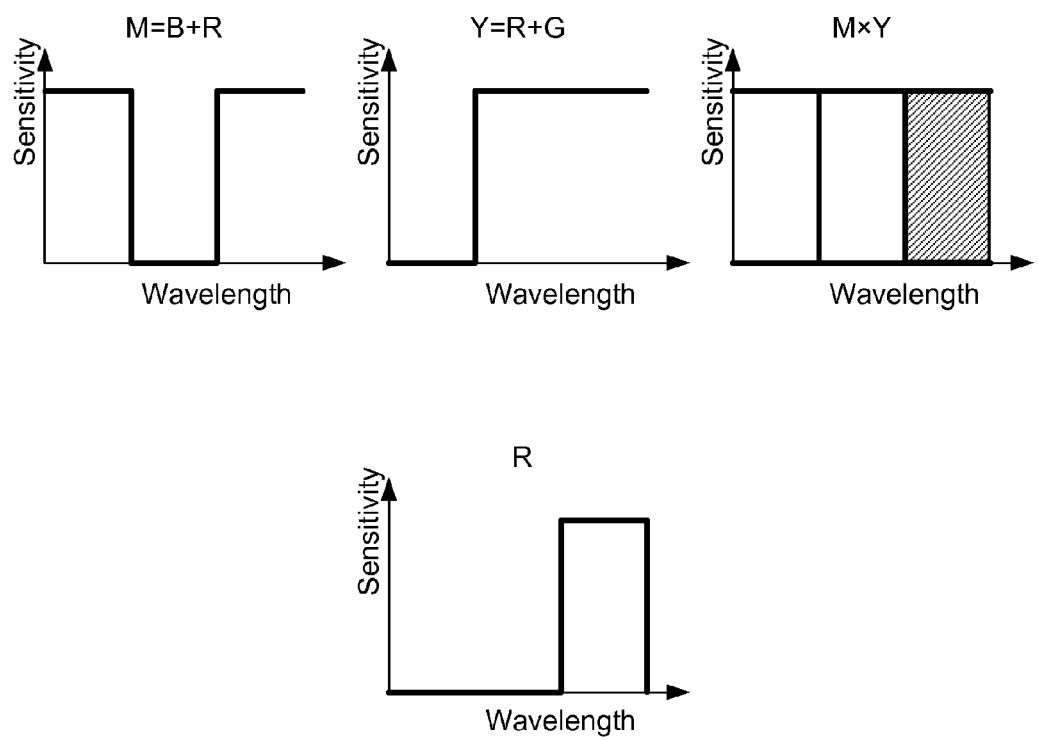
FIG. 9 is a schematic illustrating how the red sensitivity function is a product of the magenta and yellow sensitivity functions, in accordance with an embodiment of the invention.

Similarly, a set of M and Y secondary color filter elements may be used. FIG. 9 is a schematic illustrating how the R sensitivity function is a product of the M and Y sensitivity functions. Therefore, an R color signal can be produced from an M color signal and a Y color signal (i.e., R=M*Y). Referring to Eq. (2), a B color signal can be produced from an M color signal and a R color signal (i.e., B=M−R), and referring to Eq. (3) a G color signal can be produced from a Y color signal and an R color signal (i.e., G=Y−R).

Figure 10:
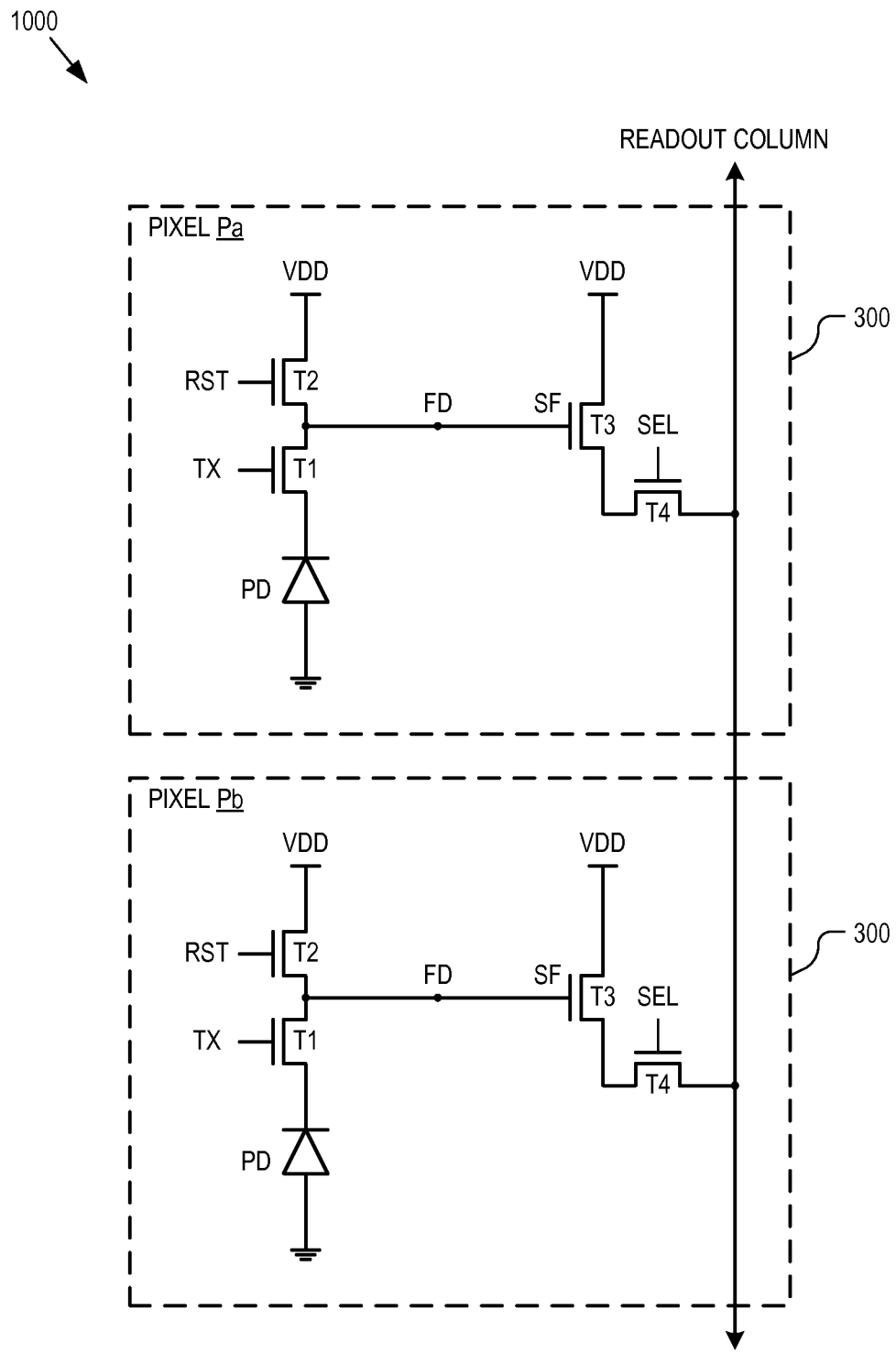
FIG. 10 is a circuit diagram illustrating pixel circuitry of two 4T pixels within an imaging system, in accordance with an embodiment of the invention.

FIG. 10 is a circuit diagram illustrating pixel circuitry 1000 of two four-transistor ("4T") pixels within a pixel array, in accordance with an embodiment of the invention. Pixel circuitry 1000 is one possible pixel circuitry architecture for implementing each pixel within pixel array 105 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 10, pixels Pa and Pb are arranged in two rows and one column. The illustrated embodiment of each pixel circuitry 1000 includes a photosensor (e.g., photodiode PD), a transfer transistor T1, a reset transistor T2, a source-follower ("SF") transistor T3 and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 1000 to the readout column line under control of a select signal SEL. In one embodiment, the TX signal, the RST signal, and the SEL signal are generated by control circuitry 115.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize. For example, although examples of CMOS color image sensors are illustrated, the embodiments may include other types of color image sensor such as charge coupled devices (CCDs) and others that use three distinct color filters to generate a three color channel signal.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A color image sensor comprising:
a pixel array including a color filter array ("CFA") overlaying an array of photo-sensors for acquiring color image data, wherein the CFA includes first color filter elements of a first color overlaying a first group of the photo-sensors and second color filter elements of a second color overlaying a second group of the photo-sensors, wherein the first group of photo-sensors generate first color signals of a first color channel and the second group of photo-sensors generate second color signals of a second color channel;
color signal combiner circuit ("CSCC") coupled to receive the first and second color signals output from the pixel array, the CSCC including a combiner coupled to combine the first and second colors signals to generate third color signals of a third color channel; and
an output port coupled to the CSCC to output the color image data having three color channels out of the color image sensor,
wherein:
the first color channel comprises a cyan color channel,
the second color channel comprises a yellow color channel,
the third color channel comprises a green color channel based on a multiplication of the cyan color channel and the yellow color channel,
the three color channels for outputting the color image data from the output port comprise the cyan color channel, the yellow color channel, and the green color channel.

2. The color image sensor of claim 1, wherein the CSCC further includes a transformer for transforming between color channels, wherein:
the three color channels for outputting the color image data from the output port comprise a red color channel, a green color channel, and a blue color channel generated by the transformer.

3. A color image sensor comprising:
a pixel array including a color filter array ("CFA") overlaying an array of photo-sensors for acquiring color image data, wherein the CFA includes first color filter elements of a first color overlaying a first group of the photo-sensors and second color filter elements of a second color overlaying a second group of the photo-sensors, wherein the first group of photo-sensors generate first color signals of a first color channel and the second group of photo-sensors generate second color signals of a second color channel;

color signal combiner circuit ("CSCC") coupled to receive the first and second color signals output from the pixel array, the CSCC including a combiner coupled to combine the first and second colors signals to generate third color signals of a third color channel; and an output port coupled to the CSCC to output the color image data having three color channels out of the color image sensor, wherein:
the first color channel comprises a cyan color channel,
the second color channel comprises a magenta color channel,
the third color channel comprises a blue color channel based on a multiplication of the cyan color channel and the magenta color channel,
the three color channels for outputting the color image data from the output port comprise the cyan color channel, the magenta color channel, and the blue color channel.

4. A color image sensor comprising:
a pixel array including a color filter array ("CFA") overlaying an array of photo-sensors for acquiring color image data, wherein the CFA includes first color filter elements of a first color overlaying a first group of the photo-sensors and second color filter elements of a second color overlaying a second group of the photo-sensors, wherein the first group of photo-sensors generate first color signals of a first color channel and the second group of photo-sensors generate second color signals of a second color channel;

color signal combiner circuit ("CSCC") coupled to receive the first and second color signals output from the pixel array, the CSCC including a combiner coupled to combine the first and second colors signals to generate third color signals of a third color channel; and an output port coupled to the CSCC to output the color image data having three color channels out of the color image sensor, wherein:
the first color channel comprises a magenta color channel,
the second color channel comprises a yellow color channel,
the third color channel comprises a red color channel based on a multiplication of the magenta color channel and the yellow color channel.

5. A color image sensor comprising:
a pixel array including a color filter array ("CFA") overlaying an array of photo-sensors for acquiring color image data, wherein the CFA includes first color filter elements of a first color overlaying a first group of the photo-sensors and second color filter elements of a second color overlaying a second group of the photo-sensors, wherein the first group of photo-sensors generate first color signals of a first color channel and the second group of photo-sensors generate second color signals of a second color channel;

color signal combiner circuit ("CSCC") coupled to receive the first and second color signals output from the pixel array, the CSCC including a combiner coupled to combine the first and second colors signals to generate third color signals of a third color channel; and an output port coupled to the CSCC to output the color image data having three color channels out of the color image sensor, wherein the CSCC includes a three channel transformer for transforming a first set of three color channels to a second set of three color channels.

* * * * *